(12) United States Patent
Sakakibara et al.

(10) Patent No.: US 12,120,901 B2
(45) Date of Patent: Oct. 15, 2024

(54) LIGHT-EMITTING ELEMENT FOR EFFICIENTLY EMITTING LIGHT IN DIFFERENT COLORS

(71) Applicant: SHARP KABUSHIKI KAISHA, Sakai (JP)

(72) Inventors: Yusuke Sakakibara, Sakai (JP); Tatsuya Ryohwa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 748 days.

(21) Appl. No.: 17/289,208

(22) PCT Filed: Oct. 30, 2018

(86) PCT No.: PCT/JP2018/040289
§ 371 (c)(1),
(2) Date: Apr. 27, 2021

(87) PCT Pub. No.: WO2020/089999
PCT Pub. Date: May 7, 2020

(65) Prior Publication Data
US 2022/0013744 A1    Jan. 13, 2022

(51) Int. Cl.
*H10K 50/16* (2023.01)
*H05B 33/10* (2006.01)
(Continued)

(52) U.S. Cl.
CPC ............ *H10K 50/16* (2023.02); *H05B 33/10* (2013.01); *H05B 33/26* (2013.01); *H10K 50/115* (2023.02); *H10K 50/15* (2023.02); *H10K 59/35* (2023.02)

(58) Field of Classification Search
CPC ...... H10K 50/858; H10K 59/12; H10K 59/38; H10K 71/00; H10K 59/1201;
(Continued)

(56) References Cited

U.S. PATENT DOCUMENTS 9,559,327 B2 *   1/2017   Yoneda .................. H10K 50/16
9,564,609 B2 *   2/2017   Sasaki .................. H10K 50/818
(Continued)

FOREIGN PATENT DOCUMENTS

JP          2010-244885 A    10/2010

*Primary Examiner* — Caleb E Henry
(74) *Attorney, Agent, or Firm* — ScienBiziP, P.C.

(57) ABSTRACT

Provided is a light-emitting element to highly efficiently emit light in different colors. The light-emitting element includes: a cathode; an anode; a light-emitting layer formed between the cathode and the anode, and including a plurality of light-emitting regions respectively emitting light of different wavelengths; and an electron-transport layer formed between the cathode and the light-emitting layer, and including a plurality of regions each corresponding to one of the light-emitting regions. The electron-transport layer includes a $Zn_{1-X}Mg_XO$ film (where X is $0 \leq X < 1$). Of the plurality of regions included in the electron-transport layer, a region, corresponding to one of the light-emitting regions that emits light of a shorter wavelength, is higher in composition ratio X of Mg and/or less in thickness of the $Zn_{1-X}Mg_XO$ film.

19 Claims, 4 Drawing Sheets

(51) Int. Cl.
*H05B 33/26* (2006.01)
*H10K 50/115* (2023.01)
*H10K 50/15* (2023.01)
*H10K 59/35* (2023.01)

(58) Field of Classification Search
CPC ............ H10K 59/1213; H10K 59/123; H10K 59/1315; H10K 59/122; G02B 30/29; G02B 3/0006; G02F 1/133526; H05K 2201/10106
See application file for complete search history.

(56) References Cited

U.S. PATENT DOCUMENTS

| | | | |
|---|---|---|---|
| 9,577,206 B2* | 2/2017 | Yamae | H10K 50/131 |
| 9,587,172 B2* | 3/2017 | Lee | H10K 50/165 |
| 9,647,228 B2* | 5/2017 | Seo | H10K 50/155 |
| 9,653,517 B2* | 5/2017 | Uesaka | H10K 59/32 |
| 10,367,162 B1* | 7/2019 | Boardman | H10K 50/82 |
| 10,522,775 B2* | 12/2019 | Tsukamoto | H05B 33/12 |
| 10,600,980 B1* | 3/2020 | Boardman | H10K 59/877 |
| 10,749,130 B2* | 8/2020 | Kim | H10K 50/805 |
| 10,826,010 B1* | 11/2020 | Montgomery | H10K 50/852 |
| 2002/0189542 A1* | 12/2002 | Van Slyke | C23C 14/12 |
| | | | 118/712 |
| 2003/0211651 A1* | 11/2003 | Krasnov | C09K 11/883 |
| | | | 438/102 |
| 2005/0098207 A1* | 5/2005 | Matsumoto | H10K 50/171 |
| | | | 313/506 |
| 2007/0286944 A1* | 12/2007 | Yokoyama | H10K 50/852 |
| | | | 427/66 |
| 2008/0264475 A1* | 10/2008 | Ito | H01M 14/005 |
| | | | 136/252 |
| 2009/0243473 A1* | 10/2009 | Iwakuma | H10K 50/11 |
| | | | 313/504 |
| 2011/0073884 A1* | 3/2011 | Lee | H10K 50/166 |
| | | | 257/89 |
| 2012/0086331 A1* | 4/2012 | Kobayashi | H10K 71/00 |
| | | | 313/504 |
| 2014/0353610 A1* | 12/2014 | Lee | H10K 71/18 |
| | | | 438/34 |
| 2016/0150619 A1* | 5/2016 | Krummacher | H10K 71/70 |
| | | | 315/224 |
| 2016/0233449 A1* | 8/2016 | Murayama | H10K 50/11 |
| 2016/0293676 A1* | 10/2016 | Komatsu | H10K 59/351 |
| 2017/0012231 A1* | 1/2017 | Mishima | H10K 59/12 |
| 2018/0062101 A1* | 3/2018 | Li | H10K 50/125 |
| 2018/0254421 A1* | 9/2018 | Kinge | H10K 71/00 |
| 2019/0013364 A1* | 1/2019 | Yokota | H10K 50/16 |
| 2019/0081263 A1* | 3/2019 | Park | H10K 50/16 |
| 2020/0266348 A1* | 8/2020 | Kim | H10K 71/40 |
| 2020/0321490 A1* | 10/2020 | Yang | B82Y 20/00 |
| 2020/0321546 A1* | 10/2020 | He | H10K 71/00 |
| 2020/0328380 A1* | 10/2020 | Benzie | H10K 50/17 |
| 2020/0411719 A1* | 12/2020 | Kimoto | H01L 33/06 |

* cited by examiner (a)

(b)

(c)

LIGHT-EMITTING ELEMENT FOR EFFICIENTLY EMITTING LIGHT IN DIFFERENT COLORS

TECHNICAL FIELD

The present disclosure relates to a light-emitting element, and a method for manufacturing the light-emitting element.

BACKGROUND ART

Among display devices, an organic electroluminescence image display device known in the art includes: a plurality of light-emitting pixels functioning as sub-pixels in red, green, and blue; and an anode, a hole-transport layer, a light-emitting layer, an electron-transport layer, and a cathode all of which are provided on a substrate. Specifically, Patent Document 1 below discloses a technique in which light-emitting pixels each include: a light-emitting region sandwiched between an anode separately formed for each of the light-emitting pixels and a cathode formed all across the light-emitting pixels; and a non-light-emitting region provided with the cathode. Such a technique reduces variation in brightness of a light-emitting panel.

CITATION LIST

Patent Literature

Patent Document 1: Japanese Unexamined Patent Application Publication No. 2010-244885

Summary of Technical Problem

Typical image display devices and above Patent Document 1 use electron-transport layers formed of the same material, and in the same thickness, for each of the light-emitting pixels.

Between sub-pixels emitting light in different colors, however, each of the light-emitting layers has, for example, a different conductor level. If the electron-transport layers stacked on these light-emitting layers are made of the same material (i.e. if the electron-transport layers are of the same conductor level), for example, the electron transport efficiency inevitably varies between the sub-pixels. As a result, some colors might decrease brightness of the emitted light and external quantum efficiency (EQE).

In view of the above problems, the present disclosure is intended to provide a light-emitting element capable of, for example, highly efficiently emitting light in different colors.

Solution to Problem

A light-emitting element according to the present disclosure includes: a cathode; an anode; a light-emitting layer formed between the cathode and the anode, and including a plurality of light-emitting regions respectively emitting light of different wavelengths; and an electron-transport layer formed between the cathode and the light-emitting layer, and including a plurality of regions each corresponding to one of the light-emitting regions. The electron-transport layer includes a $Zn_{1-X}Mg_XO$ film (where X is $0 \leq X < 1$). Of the plurality of regions included in the electron-transport layer, a region, corresponding to one of the light-emitting regions that emits light of a shorter wavelength, is higher in composition ratio X of Mg and/or less in thickness of the $Zn_{1-X}Mg_XO$ film.

Moreover, a method for manufacturing a light-emitting element of the present disclosure includes: forming an anode on the substrate; forming a light-emitting layer above the anode, the light-emitting layer including a plurality of light-emitting regions respectively emitting light of different wavelengths; and forming an electron-transport layer above the light-emitting layer, the electron-transport layer including a plurality of regions each corresponding to one of the light-emitting regions. The electron-transport layer includes a $Zn_{1-X}Mg_XO$ film (where X is $0 \leq X < 1$).

Of the plurality of regions included in the electron-transport layer, a region, corresponding to one of the light-emitting regions that emits light of a shorter wavelength, is higher in composition ratio X of Mg and/or less in thickness of the $Zn_{1-X}Mg_XO$ film. The method further includes forming a cathode above the electron-transport layer.

Advantageous Effects of Disclosure

The above features make it possible to provide a light-emitting element capable of, for example, highly efficiently emitting light in different colors.

DESCRIPTION OF EMBODIMENTS

Described below are embodiments of the present disclosure, with reference to the drawings. Note that the present disclosure can be provided in various aspects unless otherwise departing from the scope of the present disclosure, and shall not be interpreted to be limited to the descriptions of the embodiments recited below as examples.

First Embodiment

Figure 1:
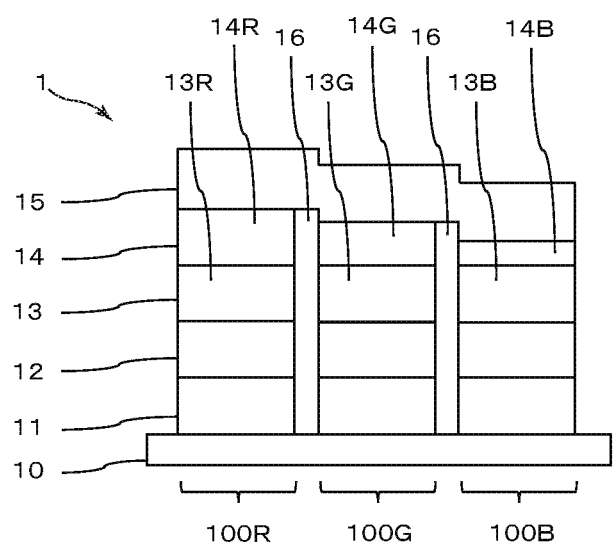
FIG. 1 schematically illustrates a stack structure of a light-emitting element according to a first embodiment of the present disclosure.

FIG. 1 schematically illustrates a stack structure of a light-emitting element according to a first embodiment of the present disclosure.

As illustrated in FIG. 1, a light-emitting element 1 according to this embodiment is structured to include: an anode 11; a hole-transport layer 12; a light-emitting layer 13; an electron-transport layer 14; and a cathode 15 stacked, in the stated order from below, on top of an array substrate 10. The anode 11 formed on the array substrate 10 is electrically connected to, for example, a thin-film transistor (TFT) of the array substrate 10. Note that, in DESCRIPTION, a direction from the array substrate 10 toward the light-emitting layer 13 is referred to as an "upward direction", and a direction from the light-emitting layer 13 toward the array substrate 10 is referred to as a "downward direction".

The light-emitting element 1 includes a plurality of light-emitting regions respectively emitting light of different wavelengths. In this embodiment, the light-emitting layer 13 includes: a red light emitting region 13R emitting red light; a green light emitting region 13G emitting green light; and a blue light emitting region 13B emitting blue light. The light-emitting element 1 includes a partition wall 16 partitioning the anode 11, the hole-transport layer 12, the light-emitting layer 13, and the electron-transport layer 14 into the red light emitting region 13R, the green light emitting region 13G, and the blue light emitting region 13B respectively forming a red sub-pixel 100R, a green sub-pixel 100G, and a blue sub-pixel 100B. Note that the cathode 15 is not partitioned by the partition wall 16, but formed in common among the sub-pixels.

Here, the red light (R) has a center wavelength in a wavelength band of 610 nm or more and 750 nm or less. The green light (G) has a center wavelength in a wavelength band of 500 nm or more and 560 nm or less. The blue light (B) has a center wavelength in a wavelength band of 435 nm or more and 480 nm or less. Note that, in the descriptions below, the reference signs R, G, and B are assigned to the constituent elements if these elements are to be distinguished from each other by the colors of emitted light. The reference signs R, G, and B are omitted if the constituent elements do not have to be distinguished from each other.

In particular, in this embodiment, the electron-transport layer 14 includes: a red electron-transport region 14R corresponding to the red light emitting region 13R; a green electron-transport region 14G corresponding to the green light emitting region 13G; and a blue electron transport region 14B corresponding to the blue light emitting region 13B. Each of the red electron-transport region 14R, the green electron-transport region 14G, and the blue electron transport region 14B is different in composition and thickness. Specifically, a material of the electron-transport layers 14R, 14G, and 14B is zinc oxide with magnesium added, so that a difference in electron affinity is 0.5 eV or lower between the electron-transport layers 14R, 14G, and 14B and the light-emitting layers 13R, 13G, and 13B. Furthermore, the electron-transport layers are formed thinner in the order of 14R, 14G, and 14B, as an electrical conductivity of the electron-transport layers decreases in the order of 14R, 14G, and 14B. Details of this feature will be described later.

Described next are the constituent elements of the light-emitting element 1 from below. Note that, in this embodiment, the light-emitting element 1 is of a top emission type in which light emitted from the light-emitting layer 13 is released upwards.

The anode 11 can be made of, for example, such conductive metals as Al, Cu, Au, and Ag having a high visible-light reflectance. Use of these metals for the anode 11 makes it possible to keep the metals from oxidizing (deteriorating over time). In forming the anode 11, for example, an anode material is sputtered to deposit a film, and the film is patterned in conformity with shapes of the sub-pixels. Hence, the anode 11 is formed for each of the sub-pixels.

The hole-transport layer 12 transports holes from the anode 11 to the light-emitting layer 13. Example materials of the hole-transport layer 12 can include PEDOT:PSS, PVK, TFB, and poly-TPD, or a composite of these materials. As to be described later, the hole-transport layer 12 does not exhibit, for example, variation in hole transport efficiency between the sub-pixels even if the same material is used for the sub-pixels. Hence, the hole-transport layer 12 may be formed of the same material for the sub-pixels. The hole-transport layer 12 is formed for each sub-pixel by, for example, ink-jet printing, vapor-deposition with a mask, or patterning by photolithography.

The light-emitting layer 13 is a layer that emits light by recombination of holes transported from the anode 11 and electrons transported from the cathode 15. In this embodiment, the light-emitting layer 13 includes not-shown quantum dots (semiconductor nanoparticles) in the form of a single layer, or of two or more layers stacked on top of another. The light-emitting layer 13 is formed of a dispersion fluid made of, for example, such a solvent as hexane and toluene in which quantum dots are dispersed. The dispersion fluid is separately applied for each of the sub-pixels by spin coating, ink-jet printing, etc. to form the light-emitting layer 13. The dispersion fluid may be mixed with a material such dispersion substances as thiol or amine.

The quantum dots, having a valence band level (equivalent to a ionization potential) and a conduction band level (equivalent to an electron affinity), are a light-emitting material emitting light by recombination of holes in the valence band and electrons in the conduction band. The quantum dots can be made of: one of semiconductor materials selected from among, for example, CdS, CdSe, CdTe, ZnS, ZnSe, ZnTe, InN, InP, InAs, InSb, AlP, AlS, AlAs, AlSb, GaN, GaP, GaAs, GaSb, PbS, Pb Se, Si, Ge, MgS, MgSe, and MgTe; or a combination of two or more of these materials. Moreover, the quantum dots may have such structures as a double-component core type, a triple-component core type, a quadruple-component core type, a core-shell type, and a core-multishell type. The quantum dots may also be formed of doped nanoparticles and of a graded composition. Light emitted from the quantum dots has a narrow spectrum because of the quantum-size effect. Hence, the emitted light can be relatively high in chromaticity.

Figure 2:
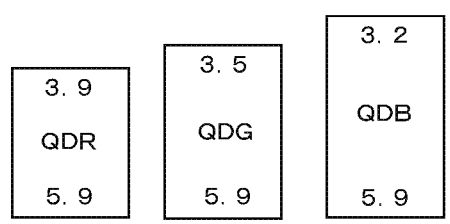
FIG. 2 illustrates an example of energy levels of light-emitting regions included in a light-emitting layer illustrated in FIG. 1.

FIG. 2 illustrates an example of energy levels of the light-emitting regions included in the light-emitting layer illustrated in FIG. 1. In this drawing, the blocks represent the red light emitting region 13R, the green light emitting region 13G, and the blue light emitting region 13B. In an upper portion of each block, an electron affinity is marked in eV with reference to a vacuum level. In a lower portion of each block, an ionization potential is marked in eV with reference to the vacuum level. In this DESCRIPTION, hereinafter, simply stating "electron affinity" or "ionization potential" means that either statement is made with reference to the vacuum level. The unit of the electron affinity and the ionization potential is eV.

If quantum dots are of the same material system, typical valence band levels of the quantum dots are substantially the same in value, regardless of the wavelengths of light emitted from the quantum dots. (See FIG. 2.) The reason is, an element forming a core of the quantum dots and having a smaller atomic number has few orbits in a closed shell, and the orbits in the closed shell make it difficult to block the atomic nucleus. Hence, the valence electrons are susceptible to an effect of an electric field generated by the atomic nucleus, and are likely to stay at a constant energy level. Hence, the valence levels are also constant, regardless of colors of light emitted from the quantum dots.

As shown in FIG. 2 of, for example, this embodiment, any of the red light emitting region 13R, the green light emitting region 13G, and the blue light emitting region 13B has an ionization potential of 5.9 eV. The value of the ionization potential is substantially the same among different sub-pixels.

In contrast, conduction band levels of the quantum dots vary, depending on wavelengths of light emitted from the quantum dots. In the conduction band levels of the quantum dots, energy levels become deeper as the wavelengths of light emitted from the quantum dots are longer, and the energy levels become shallower as the wavelengths of light emitted from the quantum dots are shorter. This is because quantum dots with a smaller band gap have a deeper conduction band level.

As shown in, for example, FIG. 2 of this embodiment, the red light emitting region 13R, the green light emitting region 13G, and the blue light emitting region 13B respectively have electron affinities of 3.9 eV, 3.5 eV, and 3.2 eV.

Returning to FIG. 1 again, the electron-transport layer 14 transports electrons from the cathode 15 to the light-emitting layer 13. In the electron-transport layer 14, the red electron-transport region 14R, the green electron-transport region 14G, and the blue electron transport region 14B each having a different composition. In this embodiment, the electron-transport layer 14 contains a material whose composition formula is represented as $Zn_{1-X}Mg_XO$ (where X is 0≤X<1). The composition ratio X of Mg varies for each of the sub-pixels. Here, $Zn_{1-X}Mg_XO$ is ZnO with a portion of Zn replaced with Mg. The composition ratio X represents a ratio of Zn included in ZnO and replaced with Mg. ZnO has a characteristic such that the higher the ratio of Zn to be replace with Mg is, the lower the ionization potential and the electron affinity are. Other than $Zn_{1-X}Mg_XO$, the electron-transport layer 14 may contain, for example, such materials as $TiO_2$, $Ta_2O_3$, and $SrTiO_3$, or a composite of these materials. The hole-transport layer 14 is formed for each sub-pixel by, for example, ink-jet printing, vapor-deposition with a mask, or patterning by photolithography.

The composition ratio X of Mg in the electron-transport regions 14R, 14G, and 14B preferably satisfies 0≤14R<14G<14B≤0.5. If the composition ratio X is within this range, the difference in electron affinity is 0.5 eV or lower between the electron-transport layer 14 and the light-emitting layer 13. The low electron affinity, for example, reduces a required voltage to be applied for injection of the electrons into the light-emitting layer 13, making it possible to reduce a drive voltage of the light-emitting element 1. More preferably, the composition ratio X is set to: 0 or higher and lower than 0.05 in the red electron-transport region 14R; 0.05 or higher and lower than 0.15 in the green electron-transport region 14G; and 0.15 or higher and lower than 0.25 in the blue electron-transport region 14B. If the composition ratio X is within these ranges, the difference in electron affinity is 0.2 eV or lower between the electron-transport layer 14 and the light-emitting layer 13. The low electron affinity, for example, further reduces the required voltage to be applied for injection of the electrons into the light-emitting layer 13, making it possible to further reduce the drive voltage of the light-emitting element 1.

The thicknesses of the electron-transport regions 14R, 14G, and 14B preferably satisfy a relationship of 14R>14G>14B. Because the electrical conductivity of $Zn_{1-X}Mg_XO$ decreases when the composition ratio X of Mg increases, the electron-transport regions 14R, 14G, and 14B are formed thinner as the composition rate X of Mg increases. Such a feature makes it possible to highly efficiently emit light in the three colors. Moreover, the electron-transport layer 14 preferably has a thickness of 5 nm or more. This is because if the thickness of the electron-transport layer 14 is less than 5 nm, the electrons cannot sufficiently be injected into the light-emitting layer 13. Furthermore, the electron-transport layer 14 preferably has a thickness of 200 nm or less. This is because if the thickness of the electron-transport layer 14 is more than 200 nm, the electron-transport layer 14 itself acts as a resistance and makes it difficult for the electrons to be injected into the light-emitting layer 13. More preferably, when the composition ratio X of the red electron-transport region 14R is set to 0 or higher and lower than 0.05, the thickness of the red electron-transport region 14R is set to 45 nm or more and less than 55 nm. When the composition ratio X of the green electron-transport region 14G is set to 0.05 or higher and lower than 0.15, the thickness of the green electron-transport region 14G is set to 35 nm or more and less than 45 nm. When the composition ratio X of the blue electron-transport region 14B is set to 0.15 or higher and lower than 0.25, the thickness of the blue electron-transport region 14B is set to 25 nm or more and less than 35 nm. In these ranges, the electrons are injected into the light-emitting layer 13 more readily.

The cathode 15 is formed in common among the sub-pixels. Example materials of the cathode 15 include such light-transparent and conductive materials as ITO, IZO, AZO, GZO, and ATO. The cathode 15 is formed, for example, in common among all the sub-pixels by, for example, sputtering.

Example materials of the partition wall 16 include such insulating organic materials as an acrylic-based resin, a polyimide-based resin, a novolak resin, and a phenol resin. In forming the partition wall 16, for example, an acrylic-based resin is applied on the array substrate 10 and the anodes 11. After that, the applied acrylic resin is patterned except the one left between the neighboring anodes 11 to cover the side faces and the peripheral ends of the neighboring anodes 11. Thus, the partition wall 16 is finalized.

Figure 3:
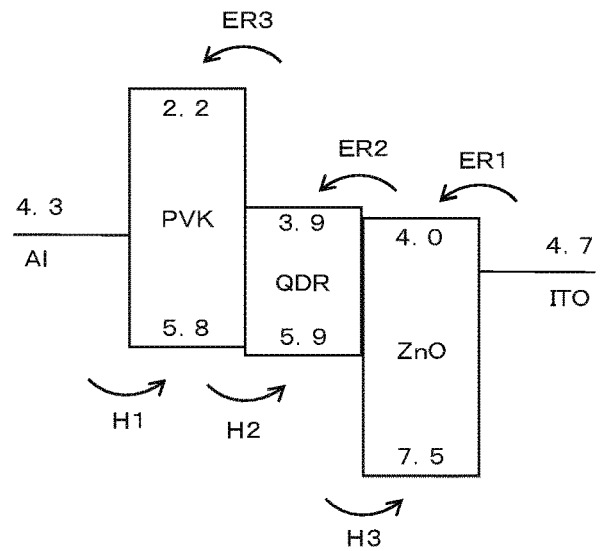
FIG. 3 illustrates an example of energy levels of layers included in the light-emitting element illustrated in FIG. 1.
Figure 3:
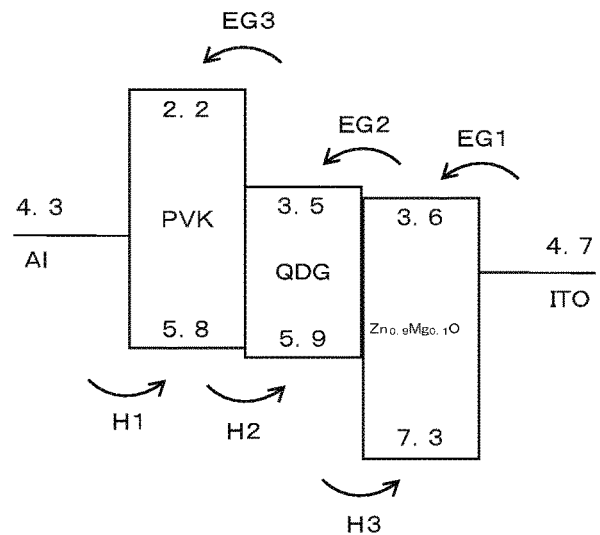
Figure 3:
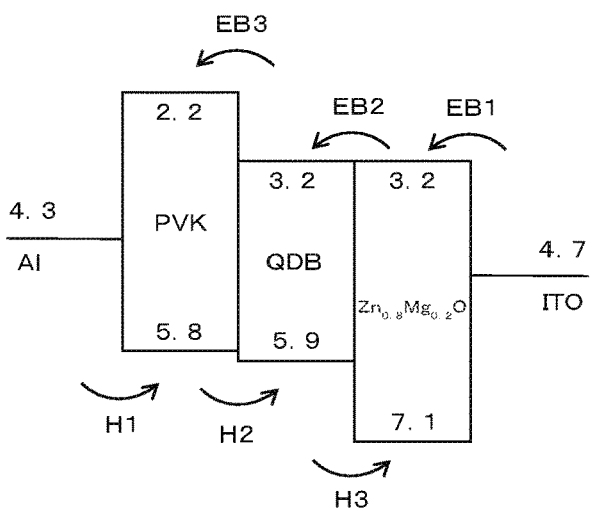

FIG. 3 illustrates an example of energy levels of layers included in the light-emitting element illustrated in FIG. 1. Illustrations (a), (b), and (c) in FIG. 3 are energy diagrams showing an example of a Fermi level, an electron affinity, and an ionization potential in each of the layers in the red sub-pixel 100R, the green sub-pixel 100G, and the blue sub-pixel 100B. Each of the illustrations is an energy diagram, for each of the sub-pixels, of the cathode 15, the electron-transport layer 14, the light-emitting layer 13, the hole-transport layer 12, and the anode 11 from right to left. The cathode 15 and the anode 11 are marked with respective Fermi levels. Each of the electron-transport layer 14, the light-emitting layer 13, and the hole-transport layer 12 is illustrated as a block. In each block, an electron affinity is marked on an upper portion and an ionization potential is marked on a lower portion.

In this embodiment, as an example, the illustrations (a), (b), and (c) in FIG. 3 show a case where the anode 11 is made of Al. In this case, the cathode 15 has a Fermi level of 4.7 eV, and the anode 11 has a Fermi level of 4.3 eV.

In this embodiment, the red electron-transport region 14R of the red sub-pixel 100R contains, for example, ZnO. As the illustration (a) of FIG. 3 shows, the red electron-transport region 14R has an ionization potential of 7.5 eV and an electron affinity of 4.0 eV. Moreover, the green electron-transport region 14G of the green sub-pixel 100G contains, for example, $Zn_{0.9}Mg_{0.1}O$. As the illustration (b) of FIG. 3 shows, the green electron-transport region 14G has an ionization potential of 7.3 eV and an electron affinity of 3.6 eV. Furthermore, the blue electron-transport region 14B of the blue sub-pixel 100B contains, for example, $Zn_{0.8}Mg_{0.2}O$. As the illustration (c) of FIG. 3 shows, the blue electron-transport region 14B has an ionization potential of 7.1 eV and an electron affinity of 3.2 eV.

In this embodiment, the hole-transport layer 12 contains PVK, and is formed in common among all the sub-pixels. Hence, as shown in the illustrations (a), (b), and (c) in FIG.

3, the hole-transport layer 12 has an ionization potential of 5.8 eV and an electron affinity of 2.2 eV in any of the sub-pixels.

Described next is how the holes and the electrons are transported in the layers of the light-emitting element 1, with reference to the illustrations (a), (b), and (c) in FIG. 3.

In the light-emitting device 1, when a potential difference occurs between the cathode 15 and the anode 11, the holes are transported from the anode 11 to the hole-transport layer 12 as indicated by arrows H1 in the illustrations (a), (b), and (c) of FIG. 3. Likewise, the electrons are injected from the cathode 15 into the electron-transport layer 14 of each sub-pixel as indicated by arrows ER1, EG1, and EB1 in the illustrations (a), (b), and (c) of FIG. 3.

Here, for example, a barrier in transport of the holes from a first layer to a second layer is indicated by an energy obtained as a difference when the ionization potential of the first layer is subtracted from the ionization potential of the second layer. Here, the hole-transport layer 12 is formed in common among all the sub-pixels. Accordingly, in injection of the holes, barriers indicated by the arrows H1 are 1.5 eV regardless of kinds of the sub-pixels.

A barrier in transport of the electrons from a first layer to a second layer is indicated by an energy obtained as a difference when the electron affinity of the second layer is subtracted from the electron affinity of the first layer. Hence, in injection of the electrons, the barriers indicated by the arrows ER1, EG1, and EB1 are 0.7 eV, 1.1 eV, and 1.5 eV.

Next, as indicated by arrows H2 in the illustrations (a), (b), and (c) of FIG. 3, the holes injected into the hole-transport layer 12 in each of the sub-pixels are transported to the light-emitting layer 13. Here, the ionization potentials of the light-emitting layer 13 are substantially equal among all the sub-pixels (see FIG. 2). Hence, in transport of the holes, barriers indicated by the arrows H2 are 0.1 eV regardless of kinds of the sub-pixels.

Likewise, as indicated by arrows ER2, EG2, and EB2 in the illustrations (a), (b), and (c) of FIG. 3, the electrons injected into the electron-transport layer 14 in each of the sub-pixels are transported to the light-emitting layer 13. Here, in transport of the electrons, barriers indicated by the arrows ER2 and EG2 are 0.1 eV; whereas, a barrier indicated by the arrow EB2 is not substantially found.

Hence, the holes and the electrons transported to the light-emitting layer 13 recombine in the quantum dots. Note that, as indicated by arrows H3 in FIG. 3, barriers in transport of the holes, from the light-emitting layer 13 to the electron-transport layer 14, range from 1.2 eV to 1.6 eV; that is, the barriers are relatively large. Thus, the recombination of the holes and the electrons in the light-emitting layer 13 occurs advantageously over the transport of the holes indicated by the arrows H3. Likewise, as indicated by arrows ER3, EG3, and EB3 in FIG. 3, barriers in transport of the electrons, from the light-emitting layer 13 to the hole-transport layer 12, range from 1.0 eV to 1.7 eV; that is, the barriers are relatively large. Thus, the recombination of the holes and the electrons in the light-emitting layer 13 occurs advantageously over the transport of the electrons indicated by the arrows ER3, EG3, and EB3.

In the light-emitting element 1 according to this embodiment, the electron-transport layer 14 is formed to suit the light-emitting layer 13 for each of the sub-pixels. Particularly, in this embodiment, in the order of the red sub-pixel 100R, the green sub-pixel 100G, and the blue sub-pixel 100B, the electron affinity of the electron-transport layer 14 decreases as that of the light-emitting layer 13 decreases. Such a feature makes it possible to decrease the barriers in transport of the electrons from the electron-transport layer 14 to the light-emitting layer 13. Moreover, in this embodiment, the barriers are 0.5 eV or lower in transport of the electrons from the electron-transport layer 14 to the light-emitting layer 13 in any of the sub-pixels; that is, the barriers are low. Such a feature makes it possible to efficiently transport the electrons from the cathode 4 to the light-emitting layer 13.

Note that, in the light-emitting element 1 according to this embodiment, the electron-transport layer 14 is higher in electron affinity than the light-emitting layer 13 in, but not limited to, any of the sub-pixels. In the light-emitting element 1 according to this embodiment, for example, the electron-transport layer 14 may be equal in value of the electron affinity to the light-emitting layer 13 in at least one of the sub-pixels. Alternatively, the electron-transport layer 14 may be lower in electron affinity than the light-emitting layer 13. In particular, between the electron-transport layer 14 and the light-emitting layer 13, the difference in electron affinity may preferably be 0.5 eV or lower. Such a feature makes it possible to improve efficiency in transport of the electrons from the electron-transport layer 14 to the light-emitting layer 13, as described above.

In this embodiment, the statement "substantially equal in value of the ionization potential" means that the difference between ionization potentials has very little influence on transport of the holes. Hence, the ionization potentials of the light-emitting layer 13 do not have to be exactly the same between different sub-pixels. For example, the ionization potential may have a margin of error ranging from 0.1 eV to 0.2 eV caused by a measurement error or a slight difference in composition of quantum dots for each of the wavelengths of light.

Second Embodiment

Figure 4:
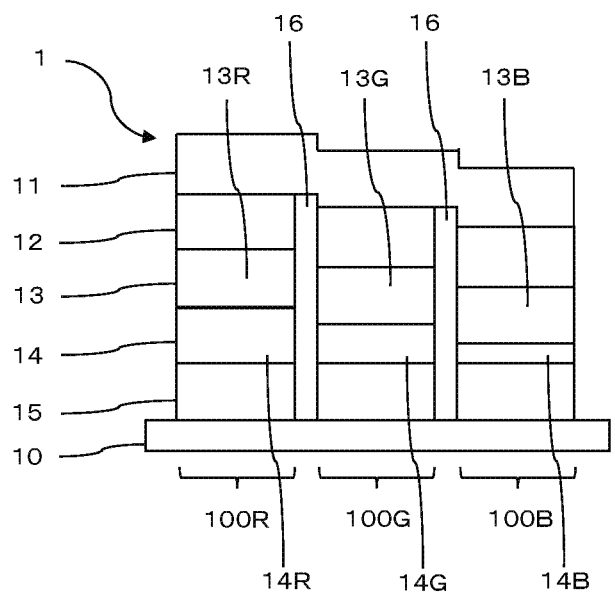
FIG. 4 schematically illustrates a stack structure of the light-emitting element according to a second embodiment of the present disclosure.

FIG. 4 schematically illustrates a stack structure of the light-emitting element according to a second embodiment of the present disclosure.

Comparing this embodiment with the first embodiment as shown in FIG. 4, the difference between the embodiments is that the layers are stacked in reverse order. Specifically, the light-emitting element 1 according to this embodiment includes: the cathode 15; the electron-transport layer 14; the light-emitting layer 13; the hole-transport layer 12; and the anode 11 stacked, in the stated order from below, on top of an array substrate 10. The lower four layers from the cathode 15 to the hole-transport layer 12 are partitioned by the partition wall 16 into the red sub-pixel 100R, the green sub-pixel 100G, and the blue sub-pixel 100B. Note that the anode 11 is not partitioned by the partition wall 16, but formed in common among the sub-pixels.

Because the anode 11 and the cathode 15 are arranged in reverse order, the materials of the anode 11 and the cathode 15 can also be switched. Specifically, if the light-emitting element 1 is of, for example, a top emission type, the anode 11 is positioned toward light emitting from the quantum dots. Hence, the anode 11 can be formed of, for example, such light-transparent and conductive materials as ITO, IZO, AZO, GZO, and ATO. Moreover, the cathode 15 is disposed to reflect the light emitted from the quantum dots. Hence, the cathode 15 can be made of, for example, such conductive metals as Al, Cu, Au, and Ag having a high visible-light reflectance.

In this embodiment, the anode 11 can be formed of, for example, ITO. Compared with use of such a metal as Al, the work function of the anode 11 comes closer to the valence band level (up to 5 eV) of the hole-transport layer 12. This feature makes it possible to increase efficiency in injecting the holes.

Third Embodiment

Figure 5:
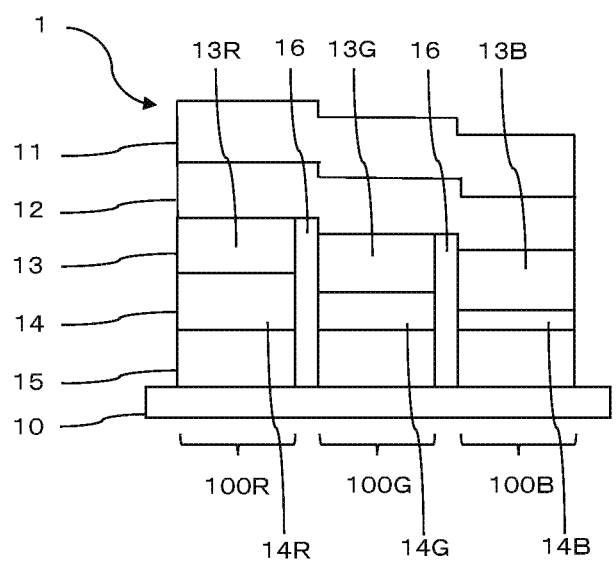
FIG. 5 schematically illustrates a stack structure of the light-emitting element according to a third embodiment of the present disclosure.

FIG. 5 schematically illustrates a stack structure of the light-emitting element according to a third embodiment of the present disclosure.

Comparing this embodiment with the second embodiment as shown in FIG. 5, the difference between the embodiments is that the hole-transport layer 12 is not partitioned by the partition wall 16, but formed into a single region in common among the sub-pixels. That is, the hole-transport layer 12 is monolithically formed in common among the sub-pixels. Note that the statement "a single region" recited in claims refers to a region monolithically formed in common among the sub-pixels as described above. The same goes to the electrodes (i.e. a cathode and an anode). Specifically, the light-emitting element 1 according to this embodiment includes: the cathode 15; the electron-transport layer 14; the light-emitting layer 13; the hole-transport layer 12; and the anode 11 stacked, in the stated order from below, on top of an array substrate 10. The lower three layers from the cathode 15 to the light-emitting layer 13 are partitioned by the partition wall 16 into the red sub-pixel 100R, the green sub-pixel 100G, and the blue sub-pixel 100B. Note that the hole-transport layer 12 and the anode 11 are not partitioned by the partition wall 16, but formed in common among the sub-pixels. In the single region formed in common among the sub-pixels, the hole-transport layer 12 and the anode 11 are positioned in regions each corresponding to one of the sub-pixels, and function as the corresponding sub-pixels.

As can be seen, if quantum dots included in the light-emitting layer 13 are of a single material system, valence band levels of the quantum dots are substantially the same in value, regardless of the wavelengths of light emitted from the quantum dots. Hence, even if the same material is used for the sub-pixels as a material of the hole-transport layer 12, the difference in value of valence band level is substantially the same between the light-emitting layer 13 and the hole-transport layer 12 among the sub-pixels. Thus, in view of, for example, reducing variation in hole transport efficiency among the sub-pixels, the hole-transport layer 12 may be made of the same material, and formed in common, among the sub-pixels.

This embodiment makes it possible to simplify a structure of, and a manufacturing method for, the light-emitting element 1, while maintaining the light emission efficiency of the colors.

Fourth Embodiment

Figure 6:
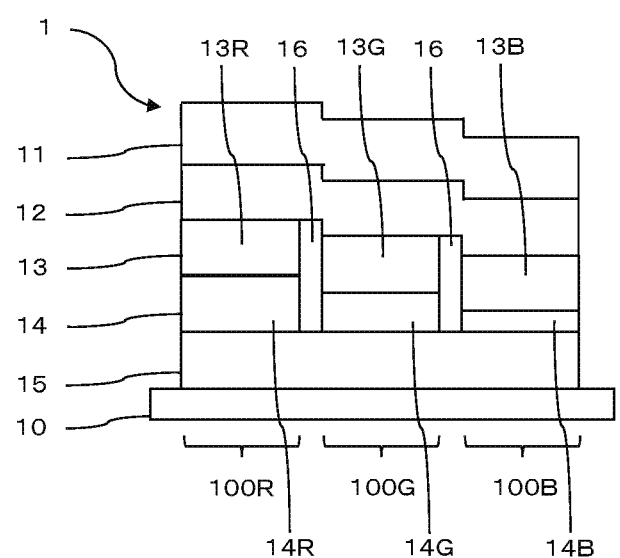
FIG. 6 schematically illustrates a stack structure of the light-emitting element according to a fourth embodiment of the present disclosure.

FIG. 6 schematically illustrates a stack structure of the light-emitting element according to a fourth embodiment of the present disclosure.

Comparing this embodiment with the second embodiment as shown in FIG. 6, the difference between the embodiments is that the cathode 15 is not partitioned by the partition wall 16, but formed into a single region in common among the sub-pixels. Specifically, the light-emitting element 1 according to this embodiment includes: the cathode 15; the electron-transport layer 14; the light-emitting layer 13; the hole-transport layer 12; and the anode 11 stacked, in the stated order from below, on top of an array substrate 10. Two of the layers; namely, the electron-transport layer 14 and the light-emitting layer 13, are partitioned by the partition wall 16 into the red sub-pixel 100R, the green sub-pixel 100G, and the blue sub-pixel 100B. Note that the cathode 15, the hole-transport layer 12, and the anode 11 are not partitioned by the partition wall 16, but formed in common among the sub-pixels. In the single region formed in common among the sub-pixels, the cathode 15, the hole-transport layer 12, and the anode 11 are positioned in regions each corresponding to one of the sub-pixels, and function as the corresponding sub-pixels.

Moreover, a feature of the light-emitting element 1 according to this embodiment is that three layers including the cathode 15, the hole-transport layer 12, and the anode 11 are used in common among the three colors. Hence, the layers may be stacked in the reverse order of those illustrated in FIG. 6. In addition, the other two layers; namely, the electron-transport layer and the light-emitting layer, may be partitioned by the partition wall into the sub-pixels.

The light-emitting element 1 according to this embodiment can simultaneously drive all of the sub-pixels including the red sub-pixel 100R, the green sub-pixel 100G, and the blue sub-pixel 100B. Hence, the light-emitting element 1 according to this embodiment causes all the sub-pixels to simultaneously emit light, making it possible to create white light. The light-emitting element 1 according to this embodiment is applicable to a white-light emitting device emitting white light such as, for example, a white-light illuminating unit and a white-light backlight unit.

The present disclosure shall not be limited to the above embodiments, and a feature of the present disclosure cited in the above embodiments may be replaced with another feature substantially identical to the feature of the present disclosure, with still another feature achieving an advantageous effect identical to that of the feature of the present disclosure, or with still another feature capable of achieving an object identical to that of the feature of the present disclosure.

For example, as illustrated in FIGS. 1 and 4 to 6, the electron-transport layers 14R, 14G, and 14B are formed to have level differences in thickness to satisfy the relationship of 14R>14G >14B. Accordingly, the entire thickness of the light-emitting element 1 appears stepwise. Accordingly, the thicknesses of the hole-transport layers 12R, 12G, and 12B may be set to satisfy a relationship of 12R<12G<12B to offset the level differences, so that the entire thickness of the light-emitting element 1 may appear constant. Such a feature allows the light-emitting element 1 to be readily applicable to, for example, light-emitting devices.

The invention claimed is:

1. A light-emitting element, comprising:
   a cathode;
   an anode;
   a light-emitting layer formed between the cathode and the anode, and including a plurality of light-emitting regions, respectively, emitting light of different wavelengths; and
   an electron-transport layer formed between the cathode and the light-emitting layer, and including a plurality of regions, each of the plurality of regions corresponding to one of the plurality of light-emitting regions,
   the electron-transport layer including a $Zn_{1-X}Mg_XO$ film (where $0 \leq X < 1$), and, of the plurality of regions included in the electron-transport layer, a region, corresponding to the one of the plurality of light-emitting regions that emits light of a shorter wavelength, being higher in a composition ratio X of Mg and less in a thickness of the $Zn_{1-X}Mg_XO$ film.

2. A light-emitting element, comprising:
   a cathode;
   an anode;

a light-emitting layer formed between the cathode and the anode, and including a plurality of light-emitting regions, respectively, emitting light of different wavelengths; and an electron-transport layer formed between the cathode and the light-emitting layer, and including a plurality of regions, each of the plurality of regions corresponding to one of the plurality of light-emitting regions, the electron-transport layer including a $Zn_{1-X}Mg_XO$ film (where $0 \leq X < 1$), and, of the plurality of regions included in the electron-transport layer, a region, corresponding to the one of the plurality of light-emitting regions that emits light of a shorter wavelength, being higher in a composition ratio X of Mg.

3. The light-emitting element according to claim 2, wherein the plurality of light-emitting regions includes a red light emitting region emitting red light, a green light emitting region emitting green light, and a blue light emitting region emitting blue light.

4. The light-emitting element according to claim 3, wherein of the plurality of regions included in the electron-transport layer, a region, corresponding to the red light emitting region, contains Mg having the composition ratio X of 0 or higher and lower than 0.05, a region, corresponding to the green light emitting region, contains Mg having the composition ratio X of 0.05 or higher and lower than 0.15, and a region, corresponding to the blue light emitting region, contains Mg having the composition ratio X of 0.15 or higher and lower than 0.25.

5. The light-emitting element according to claim 3, wherein of the plurality of regions included in the electron-transport layer, a region, corresponding to the red light emitting region, includes the $Zn_{1-X}Mg_XO$ film having a thickness of 45 nm or more and less than 55 nm, a region, corresponding to the green light emitting region, includes the $Zn_{1-X}Mg_XO$ film having the thickness of 35 nm or more and less than 45 nm, and a region, corresponding to the blue light emitting region, includes the $Zn_{1-X}Mg_XO$ film having the thickness of 25 nm or more and less than $_{35}$ nm.

6. The light-emitting element according to claim 2, wherein the light-emitting layer contains quantum dots.

7. The light-emitting element according to claim 2, further comprising:

a hole-transport layer formed between the anode and the light-emitting layer, wherein the hole-transport layer includes a single region corresponding to two or more of the plurality of light-emitting regions.

8. The light-emitting element according to claim 2, wherein at least one selected from the cathode and the anode is formed into a single region corresponding to all of the plurality of light-emitting regions, and is disposed on a substrate.

9. The light-emitting element according to claim 2, wherein both the cathode and the anode are formed into a single region corresponding to all of the plurality of light-emitting regions.

10. A light-emitting element, comprising:

a cathode;

an anode;

a light-emitting layer formed between the cathode and the anode, and including a plurality of light-emitting region, respectively, emitting light of different wavelengths; and an electron-transport layer formed between the cathode and the light-emitting layer, and including a plurality of region, each of the plurality of regions corresponding to one of the plurality of light-emitting regions, the electron-transport layer including a $Zn_{1-X}Mg_XO$ film (where $0 \leq X < 1$), and, of the plurality of regions included in the electron-transport layer, a region, corresponding to the one of the plurality of light-emitting regions that emits light of a shorter wavelength, being less in a thickness of the $Zn_{1-X}Mg_XO$ film, wherein the light-emitting layer includes a red light emitting region emitting red light, a green light emitting region emitting green light, and a blue light emitting region emitting blue light, and of the plurality of regions included in the electron-transport layer, a region, corresponding to the red light emitting region, contains Mg having a composition ratio X of 0 or higher and lower than 0.05, a region, corresponding to the green light emitting region, contains Mg having the composition ratio X of 0.05 or higher and lower than 0.15, and a region, corresponding to the blue light emitting region, contains Mg having the composition ratio X of 0.15 or higher and lower than 0.25.

11. The light-emitting element according to claim 10, wherein the light-emitting layer contains quantum dots.

12. The light-emitting element according to claim 10, further comprising:

a hole-transport layer formed between the anode and the light-emitting layer, wherein the hole-transport layer includes a single region corresponding to two or more of the plurality of light-emitting regions.

13. The light-emitting element according to claim 10, wherein at least one selected from the cathode and the anode is formed into a single region corresponding to all of the plurality of light-emitting regions, and is disposed on a substrate.

14. The light-emitting element according to claim 10, wherein both the cathode and the anode are formed into a single region corresponding to all of the plurality of light-emitting regions.

15. A light-emitting element, comprising:

a cathode;

an anode;

a light-emitting layer formed between the cathode and the anode, and including a plurality of light-emitting regions, respectively, emitting light of different wavelengths; and an electron-transport layer formed between the cathode and the light-emitting layer, and including a plurality of regions, each of the plurality of regions corresponding to one of the plurality of light-emitting regions, the electron-transport layer including a $Zn_{1-X}Mg_XO$ film (where $0 \leq X < 1$), and, of the plurality of regions included in the electron-transport layer, a region, corresponding to one of the plurality of light-emitting regions that emits light of a shorter wavelength, being less in a thickness of the $Zn_{1-X}Mg_XO$ film, wherein the light-emitting layer includes a red light emitting region emitting red light, a green light emitting region emitting green light, and a blue light emitting region emitting blue light, and of the plurality of regions included in the electron-transport layer, a region, corresponding to the red light emitting region, includes the $Zn_{1-x}Mg_xO$ film having the thickness of 45 nm or more and less than 55 nm, the region a region, corresponding to the green light emitting region-region, includes the Zn1-xMgxO film having the thickness of 35 nm or more and less than 45 nm, and a region, corresponding to the blue light emitting region, includes the $Zn_{1-x}Mg_xO$ film having the thickness of 25 nm or more and less than 35 nm.

16. The light-emitting element according to claim 15, wherein the light-emitting layer contains quantum dots.

17. The light-emitting element according to claim 15, further comprising:

a hole-transport layer formed between the anode and the light-emitting layer, wherein the hole-transport layer includes a single region corresponding to two or more of the plurality of light-emitting regions.

18. The light-emitting element according to claim 15, wherein at least one selected from the cathode and the anode is formed into a single region corresponding to all of the plurality of light-emitting regions, and is disposed on a substrate.

19. The light-emitting element according to claim 15, wherein both the cathode and the anode are formed into a single region corresponding to all of the plurality of light-emitting regions.

* * * * *